United States Patent [19]

Yasuda et al.

[11] Patent Number: 4,564,764
[45] Date of Patent: Jan. 14, 1986

[54] WAFER HAVING CHIPS FOR DETERMINING THE POSITION OF THE WAFER BY MEANS OF ELECTRON BEAMS

[75] Inventors: Hiroshi Yasuda, Yokohama; Kenichi Kawashima, Sagamihara; Takayuki Miyazaki, Nagaokakyo; Koichi Kobayashi, Yokohama, all of Japan

[73] Assignee: Fujitsu Limited, Kanagawa, Japan

[21] Appl. No.: 537,624

[22] Filed: Sep. 30, 1983

[30] Foreign Application Priority Data

Sep. 30, 1982 [JP] Japan .................................. 57-172170

[51] Int. Cl.$^4$ ............................................. G01N 23/00
[52] U.S. Cl. ................................................ 250/491.1
[58] Field of Search ............... 250/491.1, 492.2, 492.3, 250/398

[56] References Cited

U.S. PATENT DOCUMENTS 3,849,659  11/1974  O'Keefe ............................... 250/492
4,125,418  11/1978  Vinton ................................. 148/175
4,327,292   5/1982  Wang et al. ........................ 250/491.1

FOREIGN PATENT DOCUMENTS 57-95627   6/1982  Japan .................................. 250/492.2
57-210628 12/1982  Japan .................................. 250/492.2
1328976    9/1973  United Kingdom .
1326626   11/1973  United Kingdom .

Primary Examiner—Bruce C. Anderson
Assistant Examiner—Paul A. Guss
Attorney, Agent, or Firm—Armstrong, Nikaido, Marmelstein & Kubovcik

[57] ABSTRACT

A wafer having chips for determining the position of the wafer, at least one of the chips comprising a plurality of first-direction line groups formed on one side portion of the chip and a plurality of second-direction line groups formed on the other region of the chip, the first-direction line groups and the second-direction line groups being orthogonal to each other, each of the first-direction line groups comprising one first-direction main mark and one first-direction code mark expressing the position of the one first-direction main mark, each of the second-direction line groups comprising one second-direction main mark and one second-direction code mark, whereby, by scanning only one of the first-direction line groups and only one of the second-direction line groups by means of an electron beam, the position of the wafer is determined.

8 Claims, 9 Drawing Figures

WAFER HAVING CHIPS FOR DETERMINING THE POSITION OF THE WAFER BY MEANS OF ELECTRON BEAMS

BACKGROUND OF THE INVENTION

1. Field of the Invention

The present invention relates to a method for determining the position of a wafer by means of electron beams and to a wafer having chips for determining the position of the wafer. More particularly, it relates to a method and a chip for determining the position of a wafer in which the chip is given a specific pattern so as to enable accurate determination of the position of the wafer with respect to the electron beams with a small scan width.

2. Description of the Prior Art

Generally, when forming a pattern on a wafer using an electron beam exposure apparatus, the wafer must be positioned to the pattern-forming electron beam with an accuracy of about 0.1 μm.

In one conventional wafer position-determining method, a chip mounted on a wafer and having a large mark is at first scanned in a rough adjusting step using electron beams of secondary electrons, reflected electrons, and so forth, to determine the position of the wafer with an accuracy of about 1 μm. Then, another chip mounted on the wafer and having a small mark is scanned in a fine adjusting step, to determine the position of the wafer with an accuracy of 0.1 μm.

There are problems, however, in the above-mentioned prior art. First, to scan a large mark in the rough adjusting step, a long scan line is required. This, however, leads to destruction of other chips adjacent to the chip having the large mark and to destruction of the mark in one scan as the position-determining beam has the same intensity as the pattern-forming beam.

To resolve these problems, conventionally, a large chip provided with a plurality of large marks has been necessary. This, however, limits the effective use of a wafer.

Second, since the large mark in the rough adjusting chip has a relatively simple shape, it is difficult to distinguish it from dust on the wafer or other patterns on other semiconductor chips.

SUMMARY OF THE IVNENTION

An object of the present invention is, in view of the problems in the above-described prior art, to provide a method and a wafer with chips for determining the position of the wafer in which other chips are not destroyed and the same position-determining chip can be scanned a number of times.

Another object of the present invention is to provide the above method and wafer in which a relatively small position-determining chip in comparison with the conventional position-determining chip can be used, thus enabling effective use of the wafer for semiconductor chips.

A still another object of the present invention is to provide the above method and wafer in which marks on the position-determining chip can easily be distinguished from dust on the wafer or other patterns on the other semiconductor chips.

To attain the above objects, there is provided, according to one aspect of the present invention, a method for determining the position of a wafer comprising the steps of scanning, by means of an electron beam, one of a plurality of first-direction (Y-direction) line groups formed on a region of at least one position-determining chip on the wafer and extending in parallel from each other, each of the first-direction line groups comprising one first-direction main mark and one first-direction code mark expressing the position of the one first-direction main mark; and scanning, by means of an electron beam, one of a plurality of second-direction (X-direction) line groups formed on one side of the at least one position-determining chip on the wafer and extending in the direction orthogonal to the extending direction of the first-direction line groups, each of the second-direction line groups comprising one second-direction main mark and one second-direction code mark expressing the position of the one second-direction main mark.

In present invention, preferably further comprises the steps of: analyzing the scanned first-direction code mark after scanning said one first-direction line group so as to determine the position of the scanned first-direction main mark, and analyzing the scanned second-direction code mark after scanning said one second-direction line group so as to determine the position of the scanned second-direction main mark.

According to another aspect of the invention, there is also provided a wafer having position-determining chips for determining the position of said wafer by means of electron beams, at least one of said position determining chips comprising: a plurality of first-direction (X-direction) line groups formed on one side portion of said at least one position-determining chip and extending in parallel from each other; a plurlaity of second-direction (Y-direction) line groups formed on the other region of said at least one position-determining chips and extending in the direction orthogonal to the extending direction of said first-direction line groups, said second-direction line groups extending in parallel from each other; each of said first-direction line groups comprising one first-direction main mark and one first-direction code mark expressing the position of said one first-direction main mark; each of said second-direction line groups comprising one second-direction main mark and one second-direction code mark expressing the position of said one second-direction main mark; whereby, by scanning one of said first-direction line groups and one of said second-direction line groups by means of an electron beam, the position of said wafer is determined.

Said first-direction main marks may be separated from each other by a predetermined distance, and said second-direction main marks may be separated from each other by said predetermined distance.

BRIEF DESCRIPTION OF THE DRAWINGS

The above objects, advantages, and other features of the present invention will be more apparent from the following description of the embodiments with reference to the accompanying drawings, wherein.

DESCRIPTION OF THE PREFERRED EMBODIMENTS

Before describing the embodiments of the present invention, an explanation will be given of the conventional technique with reference to the drawings.

Figure 1:
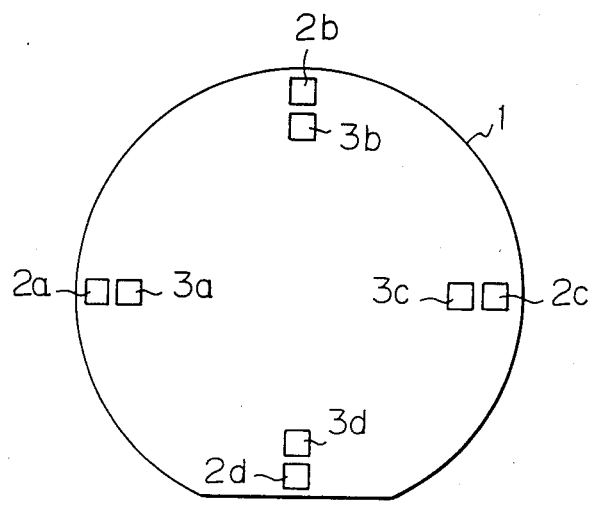
FIG. 1 is a general plan view of a wafer on which conventional position-determining chips are formd.

FIG. 1 is a general plan view of a wafer on which conventional position-determining chips are formed. In FIG. 1, on a wafer 1, rough adjusting chips 2a, 2b, 2c, and 2d, and fine adjusting chips 3a, 3b, 3c, and 3d are formed.

Figure 2:
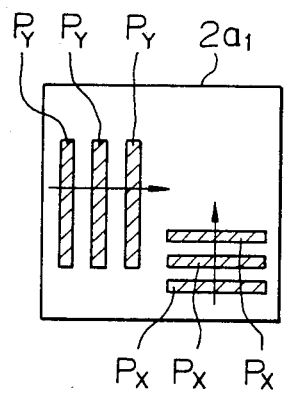
FIG. 2 is an expanded plan view of an example of a conventional rough adjusting chip on the wafer of FIG. 1.

FIG. 2 is an expanded plan view of an example of a conventional rough adjusting chip formed on the wafer 1 of FIG. 1. In FIG. 2, a rough adjusting chip $2a_1$ includes a mark consisting of patterns $P_X$ extending in the X direction and patterns $P_Y$ extending in the Y direction. The center position of the chip $2a_1$ can be determined with an accuracy of 1 $\mu$m by scanning these patterns $P_X$ and $P_Y$ in the X and Y directions by electron beams.

Figure 3:
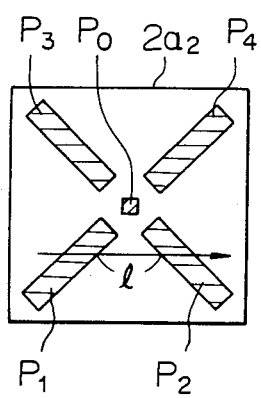
FIG. 3 is an expanded plan view of an example of another conventional rough adjusting chip on the wafer of FIG. 1.

FIG. 3 is an expanded plan view of another example of a conventional rough adjusting chip on the wafer 1 of FIG. 1. In FIG. 3, a rough adjusting chip $2a_2$ includes a mark consisting of four patterns $P_1$ through $P_4$ arranged so as to extend radially and a small square pattern $P_0$ arranged at the center of the chip $2a_2$. By scanning these patterns in the arrow direction by an electron beam, a distance l between two patterns $P_1$ and $P_2$, for example, is detected. Once the distance l is determined, the central position of the chip $2a_2$ can be determined within an accuracy of 1 $\mu$m by simple Euclidean geometry. By using the small square pattern $P_0$ as well as other patterns $P_1$ through $P_4$, the angle of rotation of the wafer 1 can be determined.

Figure 4:
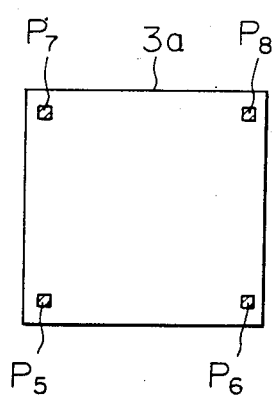
FIG. 4 is an expanded plan view of an example of a conventional fine adjusting chip on the wafer of FIG. 1.

FIG. 4 is an expanded plan view of an example of a conventional fine adjusting chip 3a on the wafer of FIG. 1. In FIG. 4, the chip 3a includes, on its four corners, small square patterns $P_5$ through $P_8$. By scanning these small patterns $P_5$ through $P_8$ in the X and Y directions, the wafer 1 (FIG. 1) can be positioned with respect to an electron beam within an accuracy of 0.1 $\mu$m.

Before the rough adjusting process, the wafer 1 is positioned on a work table with an accuracy of 2 mm through 5 mm. Therefore, the rough adjusting chips in FIGS. 1 through 3 should have a side length of at least 5 mm.

To scan the rough adjusting chips, the length of the scan line should be at least 5 mm. The distance between the position-determining chip and a semiconductor chip (not shown in FIG. 1) is less than 5 mm. Accordingly, as mentioned earlier, there is the problem that, in the rough adjusting process, a scan line may erroneously cover and thus destroy a semiconductor chip (not shown) adjacent to a rough adjusting chip.

As also mentioned earlier, there are the problems that, because each mark in FIGS. 2 or 3 is destroyed after one scanning process, a number of marks are necessary if the wafer is to be subjected to a number of position-determining processes, and that, since the marks on the rough adjusting chips $2a_1$ or $2a_2$ have relatively simple patterns, as shown in FIGS. 2 and 3, it is difficult to distinguish them from dust or other pattern on semiconductor chips.

Figure 5:
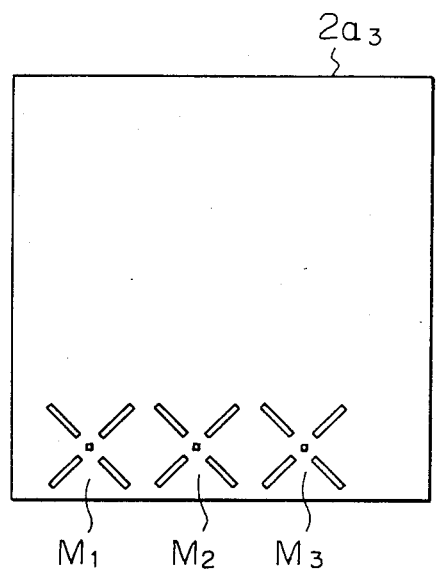
FIG. 5 is an expanded plan view of still another example of a conventional rough adjusting chip having a plurality of marks, the chip being formed on the wafer of FIG. 1.

FIG. 5 is a plan view of an example of a conventional rough adjusting chip having a plurality of marks. In FIG. 4, a number of marks $M_1$, $M_2$, $M_3$, --- are formed on one chip $2a_3$. The chip $2a_3$ is formed on the wafer 1 (FIG. 1). This constitution allows the wafer 1 to be subjected to a number of position-determining processes. The chip $2a_3$, however, has a large area, thus limiting the effective area for semiconductor chips on the wafer.

Figure 6:
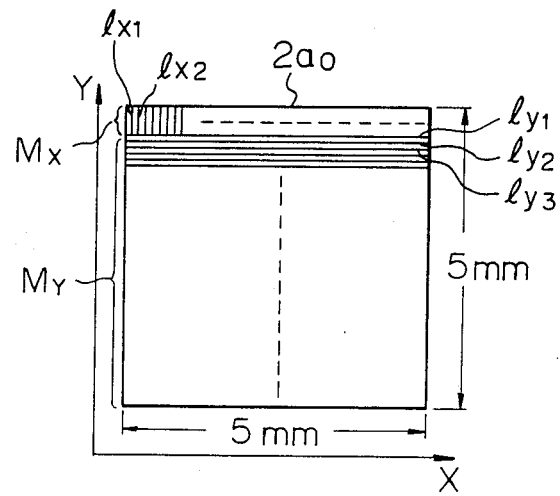
FIG. 6 is a general plan view of a position determining chip according to an embodiment of the present invention.

FIG. 6 is a general plan view of a chip for determining the position of a wafer according to an embodiment of the present invention. In FIG. 6; a position-determining chip $2a_0$ is a square having a side length of 5 mm, for example. On the upper portion of the chip $2a_0$, an X-direction mark $M_X$ is formed for roughly adjusting the position of the wafer in the X direction. The X-direction mark $M_X$ has a plurality of X-direction main marks $1_{X1}$, $1_{X2}$, --- arranged in parallel in the X direction at equal intervals therebetween. Each of the X-direction main marks $1_{X1}$, $1_{X2}$, --- extends in the Y direction and has, for example, a length of 500 $\mu$m. The interval between adjacent X-direction main marks is, for example, 100 $\mu$m. Therefore, in this case, 50 main marks are formed on the position-determining chip 2a.

In addition to the X-direction mark $M_X$ on the position-determining chip $2a_0$, there is a Y-direction mark $M_Y$ for roughly adjusting the position of the wafer in the Y direction. The Y-direction mark $M_Y$ has a plurality of Y-direction main marks $1_{y1}$, $1_{y2}$, $1_{y3}$, --- arranged in parallel in the Y direction at equal intervals therebetween. Each of the Y-direction main marks $1_{y1}$, $1_{y2}$, $1_{y3}$, --- extends in the X direction and has the same length as the side length of the position determining chip $2a_0$. The interval between adjacent Y-direction main marks is also, for example, 100 $\mu$m.

Figure 7:
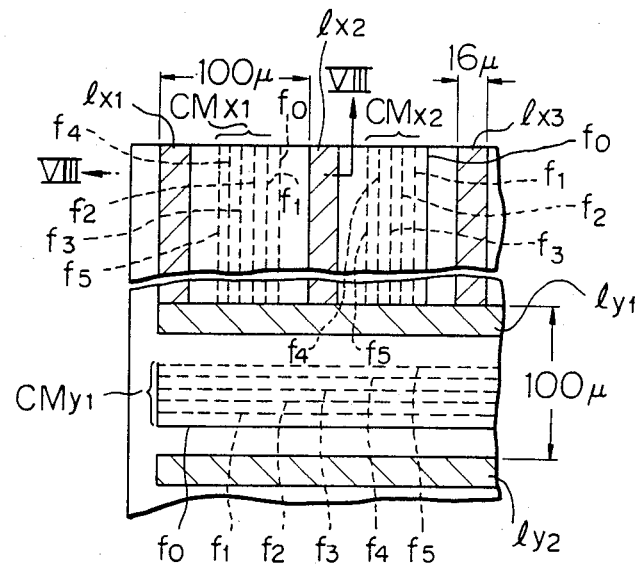
FIG. 7 is an expanded plan view of a part of FIG. 6.

FIG. 7 is an expanded plan view of a part of FIG. 6. In FIG. 7, each of the X-direction main marks $1_{x1}$, $1_{x2}$, $1_{x3}$, --- has a width of 16 $\mu$m. Each of the Y-direction main marks $1_{y1}$, $1_{y2}$, --- has the same width of 16 $\mu$m. Between adjacent X-direction main marks $1_{xi}$ and $1_{x(i+1)}$, where i=1, 2, ---, or 49, an X-direction code mark $CM_{xi}$ for roughly determining the position of the X-direction main marks is formed. Between adjacent Y-direction main marks $1_{yi}$ and $1_{y(i+1)}$, a Y-direction code mark $CM_{yi}$ for roughly determining the position of the Y-direction main marks is formed. Each X-direction code mark $CM_{xi}$ has up to six fine lines $f_0$ through $f_5$ for expressing a position code of the adjacent main mark $1_{xi}$. In FIG. 7, $CM_{x1}$ has no fine lines, while $CM_{x2}$ has one fine line $f_0$. In the figure, solid lines are used to indicate actual fine lines. The dash lines in the figure indicate merely the possible positions of other fine lines and are provided only for ease of understanding. Each fine line $f_n$ (where n=0, 1, 2, ---, or 5) expresses a binary code "1", while the lack of a fine line $f_n$ expresses "0" in the n-th bit of a six-bit binary number. The fine line $f_0$ in the X-direction code mark $CM_{x2}$ thus expresses "1", while the empty positions of the fine lines $f_1$ through $f_5$ in the code mark $CM_{x2}$ express "0"s. Thus, the X-direction code mark $CM_{x2}$ expresses a position code $000001=1$ of the main mark $l_{x2}$ adjacent to the X-direction code mark $CM_{x2}$. Similarly, since none of the positions of the fine lines $f_0$ through $f_5$ in the X-direction code mark $CM_{x1}$ are filled, the X-direction code mark $CM_{x1}$ expresses a position code $000000=0$ of the main mark $l_{x1}$ adjacent to the X-direction code mark $CM_{x1}$.

Each Y-direction code mark $CM_{yi}$ also has up to six fine lines $f_0$ through $f_5$ so as to express a position code of the adjacent main mark $l_{yi}$. For example, the Y-direction code mark $CM_{y1}$ has only one fine line $f_0$ to express a code $000001=1$.

Figure 8:
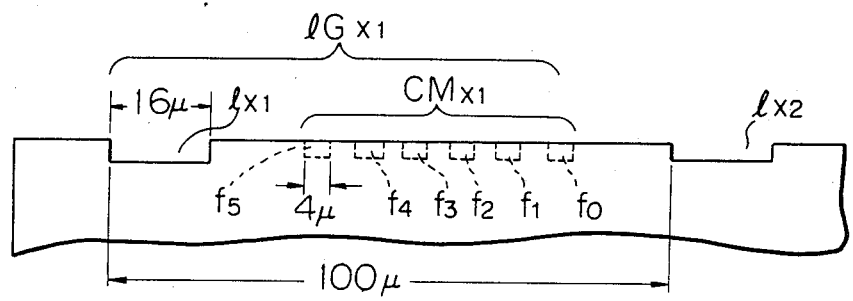
FIG. 8 is an expanded cross-sectional view taken along line VII—VII of FIG. 7.

FIG. 8 is an expanded cross-sectional view taken along line VIII—VIII of FIG. 7. In FIG. 8, the X-direction code mark $CM_{x1}$ actually has no fine line. If a fine line did exist, it would have a width of, for example, 4 $\mu$m. The X-direction main marks $l_{x1}$, $l_{x2}$, --- are formed as grooves formed on the wafer 1. The X-direction main mark $l_{x1}$ and its adjacent X-direction code mark $CM_{x1}$ constitute a line group $lG_{x1}$. Generally, an X-direction main mark $l_{xi}$ and its adjacent X-direction code mark $CM_{xi}$ constitute a line group $lG_{xi}$.

A method for determining the position of a wafer by using the position-determining chip of FIG. 6 through 8 will now be described.

After placing a wafer on a work table within an accuracy of 5 mm in a conventional manner, the position-determining chip $2a_0$ is scanned in the Y direction by an electron beam with a scan length of 100 $\mu$m so as to scan one of the Y-direction main marks $l_{y1}$, $l_{y2}$, ---. Because the scan length and the interval between adjacent main marks are only 100 $\mu$m, respectively, the electron beam does not scan and destroy any semiconductor chip adjacent to the position-determining chip $2a_0$.

If no Y-direction main mark is found, the work table is moved in the Y direction by 50 $\mu$m. The process is repeated until a Y-direction main mark is found.

When a Y-direction main mark is found, the Y-direction code mark in the line group including the found Y-direction main mark is read so as to determine the position of the scanned Y-direction main mark. Thus, the scanned Y-direction main mark can be identified among a number of Y-direction main marks. As a result, the Y-direction position of the wafer is determined with an accuracy of 100 $\mu$m. The work table is then moved in the Y direction so that the electron beam can scan the region of the X-direction mark $M_x$. This movement is easily carried out because the distance between the position of the found Y-direction main mark and the region of the X-direction mark $M_x$ can be known by calculation.

Then, similar to the above, the position-determining chip $2A_0$ is scanned in the X direction by an electron beam with a scan length of 100 $\mu$m so as to scan one of the X-direction main marks $l_{x1}$, $l_{x2}$, ---.

If no X-direction main mark is found, the work table is moved in the X-direction by 50 $\mu$m. The process is repeated until an X-direction main mark is found.

When an X-direction main mark is found, the X direction code mark in the line group including the found X-direction main mark is read to determine the position of the scanned X-direction main mark with an accuracy of 100 $\mu$m. As a result, the scanned X-direction main mark can be identified among a number of X-direction main marks.

Thus, by using a short scan line of only 100 $\mu$m and by scanning only one of the Y-direction main marks $l_{y1}$, $l_{y2}$, --- in the Y direction and only one of the X-direction main marks $l_{x1}$, $l_{x2}$, --- in the X direction, the position of the wafer can be determined with an accuracy of 100 $\mu$m.

Once the positions of the X-direction main mark and the Y-direction main mark are roughly determined, the central position between the scanned X-direction main mark and its adjacent X-direction main mark and the central position between the scanned Y-direction main mark and its adjacent Y-direction main mark can be determined with an accuracy of 0.1 $\mu$m in a conventional way, for example, by determining the edges of the scanned main marks and their adjacent main marks.

Since there are numerous X-direction main marks $l_{x1}$, $l_{x2}$, --- and Y-direction main marks $l_{y1}$, $l_{y2}$, ---, in this case 50 and 45, respectively, the possibility of scanning the same X-direction main mark or the same Y-direction main mark in a plural wafer processings is low. To avoid even this low possibility of scanning the same main marks, however, random selection of line groups may be used so as to scan different portions in different processings.

Figure 9:
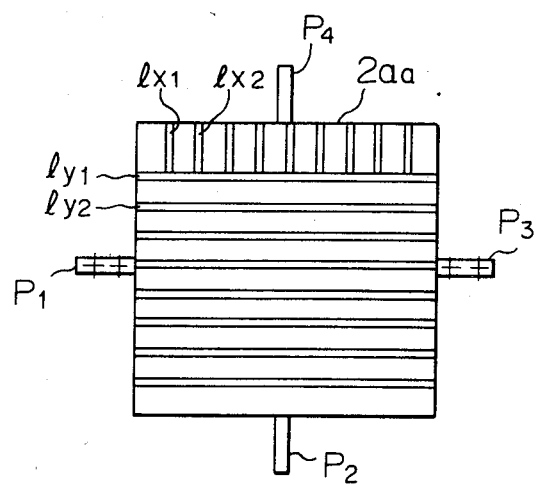
FIG. 9 is a general plan view of a position-determining chip according to another embodiment of the present invention.

FIG. 9 is a general plan view of a position-determining chip according to another embodiment of the present invention. The difference between FIG. 6 and FIG. 9 is that, in FIG. 9, the position-determining chip $2a_0$ has, on its periphery, projected patterns $P_1$ through $P_4$ for detecting the angle of the wafer rotation. By scanning the patterns $P_1$ and $P_3$ in the X and Y directions with a scan width of 100 $\mu$m, the inclination of the wafer with respect to the X direction can be determined. Similarly, by scanning the pattern $P_2$ and $P_4$, the inclination of the wafer with respect to the Y direction can be determined.

The present invention is not restricted to the above-described embodiments. Various changes and modifications are possible without departing from the spirit of the present invention. For example, the position and the size of the region for the X-direction main marks or the Y-direction main marks may be changed. Also, the number of the main marks may be changed. Each code mark may have any number of fine lines. Further, instead of forming grooves for the main marks and the code marks on the wafer, these marks may be formed by projections on the wafer or by different material such as silicon dioxide, aluminum, polycrystalline silicon, phosphosilicate glass, and silicon nitride, on the silicon wafer.

From the foregoing description, it will be apparent that, according to the present invention, by forming, on a wafer position-determining chip, a number of main marks and code marks therebetween for expressing the positions of the main marks, the position of the wafer can be determined without destroying other chips as the position-determining chip can be scanned with a short scanning line in comparison with the prior art.

Further, by using a position-determining chip having relatively complex marks in comparison with conventional simple marks, the marks on the position-determining chip can easily be distinguished from dust on the wafer or other patterns on the other semiconductor chips.

Still further, since a plurality of line groups is provided the scan length is very short, the position-determining chip can withstand a number of scans by electron beams.

Still further, since the position-determining chip is made small in comparison with conventional position-determining chips including a number of marks, the wafer can effectively be used for semiconductor chips.

The present invention may not only applied to an electron beam exposure apparatus, but also to a wafer inspecting apparatus using electron beams or to a size-length measuring apparatus using electron beams.

We claim:

1. A wafer having position determining chips for determining the position of said wafer by means of electron beams, at least one of said position-determining chips comprising:

a plurality of first-direction line groups formed on one side portion of said at least one position-determining chip and extending in parallel to each other;

a plurality of second-direction line groups formed on the other region of said at least one position-determining chips and extending in the direction orthogonal to the direction of said first-direction line groups, said second-direction line groups extending in parallel to each other;

each of said first-direction line groups comprising one first-direction main mark and one first-direction code mark expressing the position of said one first-direction main mark, wherein said first-direction code mark is different for each of said first-direction line groups;

each of said second-direction line groups comprising one second-direction main mark and one second-direction code mark expressing the position of said one second-direction main mark, wherein said second-direction code mark is different for each of said second-direction line groups; whereby, by scanning one of said first-direction line groups and one of said second-direction line groups by means of an electron beam, the position of said wafer is determined.

2. A wafer as set forth in claim 1, wherein said first-direction main marks are separated from each other by a predetermined distance, and said second-direction main marks are separated from each other by said predetermined distance.

3. A wafer as set forth in claim 2, wherein the length of each of said second-direction main marks and of said second-direction code marks is the same as the side length of said at least one position-determining chips, and the length of each of said first-direction main marks and of said first-direction code marks is shorter than the side length of said at least one position-determining chips.

4. A wafer as set forth in claim 3, wherein the length of said first-direction main marks and of said first-direction code marks is equal to or smaller than 500 $\mu$m.

5. A wafer as set forth in claim 4, wherein each of said first-direction code marks and said second-direction code marks comprises a predetermined number of fine lines for expressing the position of the corresponding first-direction main mark or of the corresponding second-direction main mark.

6. A wafer as set forth in claim 5, wherein said predetermined distance is equal to or smaller than 100 $\mu$m.

7. A wafer as set forth in claim 6, wherein at least one of said position-determining chips further comprises, on the periphery of said at lease one position-determining chips, a plurality of projected patterns for detecting the angle of rotation of said wafer.

8. A wafer as set forth in claim 7, wherein said projected patterns are provided on all sides of said at least one position determining chips.

* * * * *